United States Patent [19]

Tada et al.

[11] Patent Number: 4,563,093
[45] Date of Patent: Jan. 7, 1986

[54] VOLTAGE AND ELECTRIC FIELD MEASURING DEVICE USING LIGHT

[75] Inventors: Kohji Tada; Yoshiki Kuhara; Masami Tatsumi; Akihiko Kawakami, all of Osaka, Japan

[73] Assignee: Sumitomo Electric Industries, Ltd., Osaka, Japan

[21] Appl. No.: 452,326

[22] Filed: Dec. 22, 1982

[30] Foreign Application Priority Data

Dec. 24, 1981 [JP] Japan ................. 56-212235

[51] Int. Cl.$^4$ ............................. G01J 4/00
[52] U.S. Cl. ............................. 356/368; 324/96
[58] Field of Search ............ 356/368; 350/389, 390; 324/96

[56] References Cited

U.S. PATENT DOCUMENTS 4,269,483  5/1981  Feldtkeller ............... 356/368 X
4,465,969  8/1984  Tada et al. ............... 350/390 X

OTHER PUBLICATIONS

Hamasaki et al., "Optical Fiber Sensor for the Measurement of Electric Field Intensity and Voltage (OPSEF)", *Fiber and Integrated Optics*, vol. 3, No. 4, pp. 383–389, 1981.

IEEE Transaction on Power Apparatus and Systems, vol. PAS-99, No. 3, May/Jun. 1980 The Use of Fiber Optics for Communications, Measurement and Control Within High Voltage Substantiations".

Nissin Denkigiho, vol. 24, No. 2, (Apr. 1979), "Voltage Measuring Device Using Laser".

Electrical Review, vol. 201, No. 11, Sep. 16, 1977, Optical Methods for Measurement of Current and Voltage at High Voltage.

Electronics Letters, 4-15-82, vol. 18, No. 8, pp. 327–328, Electric Field Sensitive Optical Fibre Using Piezoelectric Polymer Coating.

*Primary Examiner*—Davis L. Willis
*Assistant Examiner*—Matthew W. Koren
*Attorney, Agent, or Firm*—McCormick, Paulding & Huber

[57] ABSTRACT

A voltage and electric field measuring device is disclosed. The device uses light, including a polarizer, an electro-optic crystal consisting of a material having an optical rotatory power, and an analyzer arranged in the stated order in the direction of advancement of applied light, with a quarter-wave plate being disposed between the polarizer and crystal or between the crystal and analyzer. The angle of orientation $\psi$ of the analyzer, relative to the optical axis of the crystal, is set to the product of $\theta$ and l, where $\theta$ represents the optical rotatory power, with respect to the applied light, of the crystal near a point at the center of a range of varying temperatures at the installation environment, and l represents the thickness of the crystal measured in the direction of advancement of light. The specified relation between $\psi$ and $\theta \cdot l$ maximizes the temperature stability of the device.

7 Claims, 11 Drawing Figures

VOLTAGE AND ELECTRIC FIELD MEASURING DEVICE USING LIGHT

BACKGROUND OF THE INVENTION

This invention relates to a device for optical measurement of voltage and electric field by making use of an electro-optic crystal.

Fundamentally, a device for optical measurement of voltage and electric field by making use of an electro-optic crystal operates by measuring a voltage which is applied to the electro-optic crystal. Such a device may be used as a voltage measuring device if electrodes connected to both surfaces of the electro-optic crystal are connected directly to terminals across which a voltage to be measured is applied, and can be used as an electric field measuring device if it is placed in an electric field to be measured with the electrodes removed.

An example wherein the foregoing device is used as a voltage measuring device is shown in FIG. 1(a). The voltage measuring device includes a polarizer 2, a quarter-wave plate 3, an electro-optic crystal 4 and an analyzer 5 arranged in the stated order in the direction of advancement of light from a light source 1. A pair of transparent electrodes 6 (of which only one is visible in the drawing) are affixed to the electro-optic crystal 4, one on each of the opposing sides, and are supplied by a voltage source 7 with a voltage to be measured. Meanwhile, the polarizer 2 converts the light from the light source 1 into linearly polarized light, which is in turn converted into circularly polarized light by the quarter-wave plate 3. The electro-optic crystal 4 subjects the circularly polarized light to phase modulation to effect a conversion into elliptically polarized light. If we let the indices of refraction of the electro-optic crystal 4 be denoted by $n_x$, $n_y$ when the voltage to be measured is at zero, then applying a voltage of V volts will cause these indices to change to $n_x - KV$, $n_y + KV$, respectively, where $n_x$ is the refractive index for linear polarization in the X-direction, $n_y$ is the refractive index for linear polarization in the Y-direction, and K is a constant. Since the refractive indices of the crystal with respect to the polarized light differ in the X and Y directions, that is, since there is a difference in the speed of light along the X- and Y-direction vector components of the circularly polarized light, the light which has been circularly polarized by the quarter-wave plate 3 is converted into elliptically polarized light owing to a phase conversion effected by passage through the electro-optic crystal 4.

In the conventional apparatus, the plane of polarization of the analyzer 5 is set at an angle of 45° with respect to the optical axis of the electro-optic crystal, with the elliptically polarized light being subjected to amplitude modulation. The reason for the inclination of 45° is to maximize sensitivity and improve linearity, as will be described later with reference to FIG. 1(b).

If we let the power of the light incident upon the polarizer 2 be represented by $P_{in}$ and the measuring section loss be represented by $l'$, then the relation between the power $P_{out}$ of the light delivered by the analyzer 5 and a voltage $V_{in}$ to be measured will be expressed by the following equation in the absence of the quarter-wave plate 3:

$$P_{out} = l' \cdot P_{in} \cdot \sin^2\left(\frac{\pi}{2} \cdot \frac{V_{in}}{V_\pi}\right) \tag{1}$$

where $V_\pi$ is the half-wave voltage which depends upon the type of electro-optic crystal and the orientation of its optical axis when in use. In order to employ a region of the characteristic curve of Eq. (1) that has good linearity, it suffices to insert the quarter-wave plate 3, which serves as optical biasing means, between the polarizer 2 and electro-optic crystal 4, or between the crystal and the analyzer 5. Such an expedient enables the selection of a region near the point $\lambda/4$ where the curve has good linearity, as depicted in FIG. 1(b). With the quarter-wave plate 3 inserted, $P_{out}$ is given by the following equation:

$$P_{out} = l' \cdot P_{in} \cdot \sin^2\left(\frac{\pi}{2} \cdot \frac{V_{in}}{V_\pi} + \frac{\pi}{4}\right)$$

$$= \frac{1}{2} l' \cdot P_{in} \cdot \left[1 + \sin\left(\frac{\pi V_{in}}{V_\pi}\right)\right]$$

The foregoing may be rewritten as follows in the range $$\pi \frac{V_{in}}{V_\pi} << 1: \tag{2}$$

$$P_{out} \approx \frac{1}{2} l' \cdot P_{in} \cdot \left[1 + \frac{\pi V_{in}}{V_\pi}\right]$$

The optical signal output of the analyzer is converted into an electric signal through use of an element such as a PIN photo-diode, thereby enabling determination of the voltage $V_{in}$.

Illustrated in FIG. 1(c) is an example of another known arrangement for supplying the electro-optic crystal 4 with a voltage to be measured. This arrangement serves the same purpose as the arrangement of FIG. 1(a), as will be described below.

Voltage measurement carried out in accordance with the foregoing principles is well-known in the art, in which crystals of KDP, ADP, LiNbO$_3$ and LiTaO$_3$, etc., are employed as the electro-optic crystal 4. The use of these crystals results in the same disadvantage, however, namely a poor temperature characteristic exhibited by the measuring device relying upon them. More specifically, the characteristic is such that the sensitivity of the device fluctuates with temperature. Each of the aforementioned crystals has refractive indices $n_x$, $n_y$ that are slightly different from each other, and the refractive indices $n_x$, $n_y$ exhibit different temperature characteristics. In other words, such crystals have a natural birefringence, as may be expressed by $n_x = n_o - KV$, $n_y = n_e + KV$, with the indices of birefringence along the respective main axes having mutually different temperature characteristics. This is the cause of the afore-mentioned poor temperature characteristic possessed by the measuring device.

In order to compensate for this instability with respect to temperature change, a so-called "temperature compensation-type" arrangement, shown in FIG. 2, has been proposed in which two crystals A and B are coupled together with the orientations of their optical axes displaced from each other by 90 degrees. If the crystals A and B are precisely machined so that the length $l_1$ of crystal A is exactly equal to the length $l_2$ of crystal B, and if the crystals are then joined with their optical axes displaced correctly by 90 degrees, this will eliminate a term, in a theoretical equation expressing $P_{out}$, which includes the difference between the refractive index $n_o$ of an ordinary ray and the refractive index $n_e$ of an extraordinary ray. In theory, therefore, this should make it possible to effect a certain degree of improvement in the temperature characteristic. In actual practice, however, it is extremely difficult to machine two crystals to exactly the same length and join them together with their optical axes meeting at 90 degrees. The result is a temperature compensation-type apparatus that is high in cost.

FIG. 3 shows an example of a temperature characteristic exhibited by a temperature compensation-type voltage measureing device using a crystal of LiNbO$_3$. The relative degree of modulation (m) when a voltage ($V_{in}$) of constant magnitude is applied to the crystal is plotted along the vertical axis as a function of temperature. Where the relative degree of modulation (m) is defined by the following equation:

$$m = \frac{(P_{out} \text{ for zero input voltage}) - (P_{out} \text{ for applied } V_{in})}{(P_{out} \text{ for zero input voltage})}$$

Substituting Eq. (2) into the above gives:

$$m = \frac{\pi V_{in}}{V_\pi}$$

This result shows that the temperature compensation is very difficult for the crystals with natural birefringence.

The application has already invented and filed (Japanese Patent Application No. 2274/80, Japanese Patent Public Disclosure No. 100364/81) a voltage and electric field measuring device in which bismuth silicon oxide (Bi$_{12}$SiO$_{20}$, referred to hereinafter as BSO), or bismuth germanium oxide (Bi$_{12}$GeO$_{20}$, referred to hereinafter as BGO), is used as the electro-optic crystal. Though both BSO and BGO are characterized by an optical rotatory power, the temperature stability of a voltage and electric field measuring device that uses either of these materials is excellent, being within ±2% in a temperature range of from $-15°$ to $60°$ C. The fact that these materials afford such a high temperature stability indicates that they may be used to great advantage in devices for measuring voltages and electric fields in a variety of electrical systems that tend to sustain temperature fluctuations over a wide temperature range.

SUMMARY OF THE INVENTION

An object of the present invention is to provide a voltage and electric field measuring device using light which, owing to a further improvement in the temperature stability of a voltage and electric field measuring device using highly temperature-stable BSO or BGO, may be applied to voltage and field measurements at permanent facilities such as power system substations, or in cases where high stability (a variation of ±1% or less within a temperature range of 20±40° C.) is demanded with respect to pronounced variations in temperature.

The invention effects an improvement in the temperature stability of a voltage and electric field measuring device, of the type which uses polarized light, by utilizing a material having an optical rotatory power, such as highly temperature-stable bismuth silicon oxide (Bi$_{12}$SiO$_{20}$) or bismuth germanium oxide (Bi$_{12}$GeO$_{20}$), as the electro-optic crystal, and by establishing a specific relation between the dimensions (thickness) of the electro-optic crystal and the orientation of the analyzer.

Other features and advantages of the invention will be apparent from the following description taken in conjunction with the accompanying drawings.

DESCRIPTION OF THE PREFERRED EMBODIMENT

The present invention is based upon a newly discovered phenomenon, described hereinbelow, found in crystals of BSO or BGO but not seen in the conventional electro-optic materials, such as LiNbO$_3$, LiTaO$_3$, KDP and ADP.

Figure 1A:
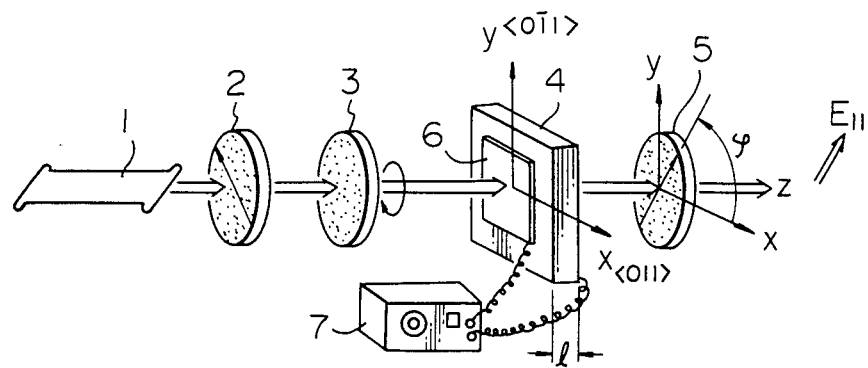
FIG. 1(a) is a view showing the basic arrangement of a voltage and electric field measuring device using light, in which the electro-optic crystal is longitudinally disposed.
Figure 1B:
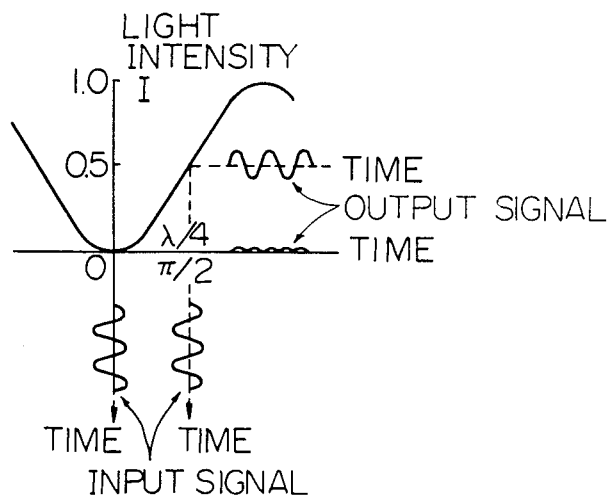
FIG. 1(b) is a waveform diagram useful in describing the action of a quarter-wave plate.
Figure 4:
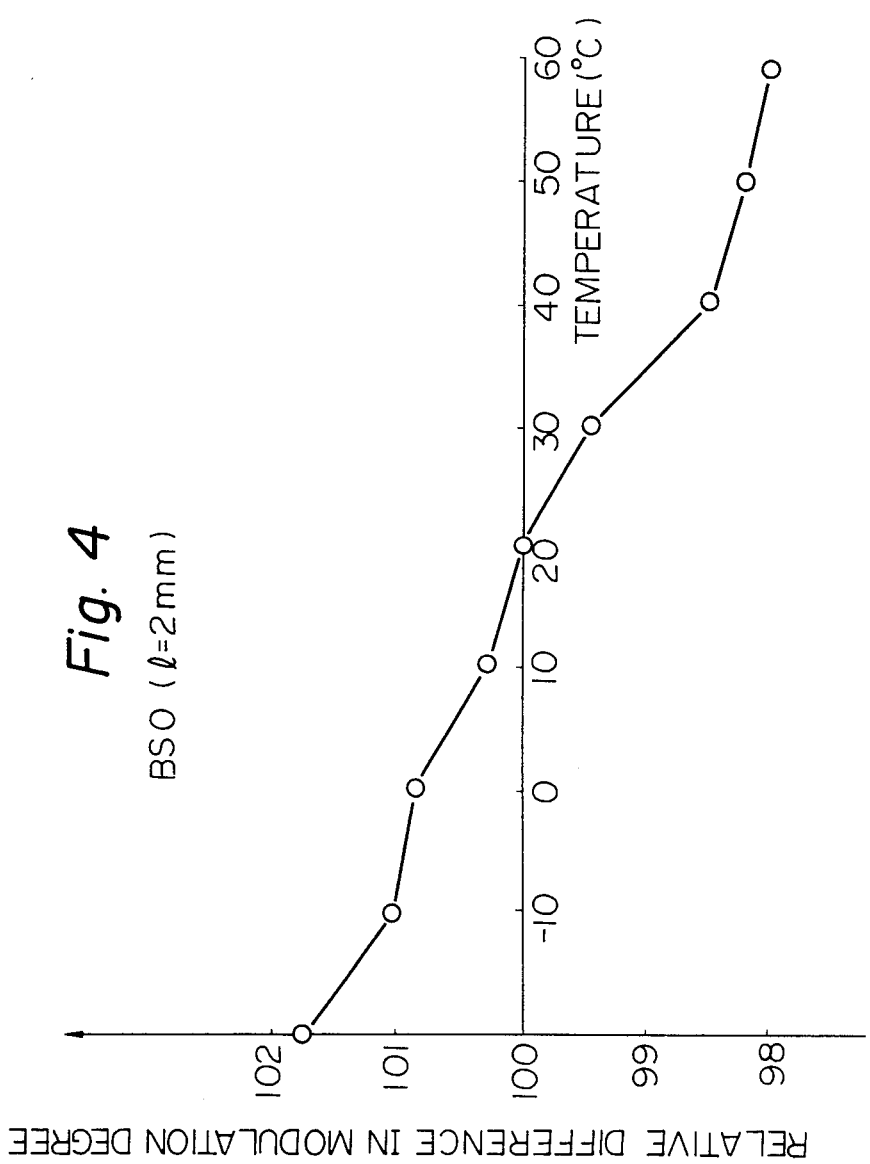
FIG. 4 is a graphical representation showing an example of temperature stability possessed by a voltage measuring device, using a crystal of Bi$_{12}$SiO$_{20}$, disclosed in Japanese Patent Public Disclosure No. 100364/81.

FIG. 4 is a graphical representation illustrating the temperature stability of a conventional voltage and electric field measuring device using a BSO crystal having a thickness of 2 mm. The graph shows a general tendency for sensitivity to decrease as temperature rises. The graphed results are for a case where the angle of orientation ψ of the polarizer in FIG. 1 is set at 45° relative to the optical axis of the crystal. The inventors, making use of the fact that both BSO and BGO exhibit optical rotatory power, performed experimental measurements to determine temperature stability while varying the angular orientation of the analyzer. The light source used in performing the measurements was light-emitting diode having a wavelength of 870 nm (used throughout the following experiments). The BSO and BGO crystals used had dimensions of 10×10×2 mm³ and were provided with transparent electrodes of In₂O₃. The temperature of the BSO, BGO crystals was varied under an applied voltage of 200 V A.C.

Figure 5:
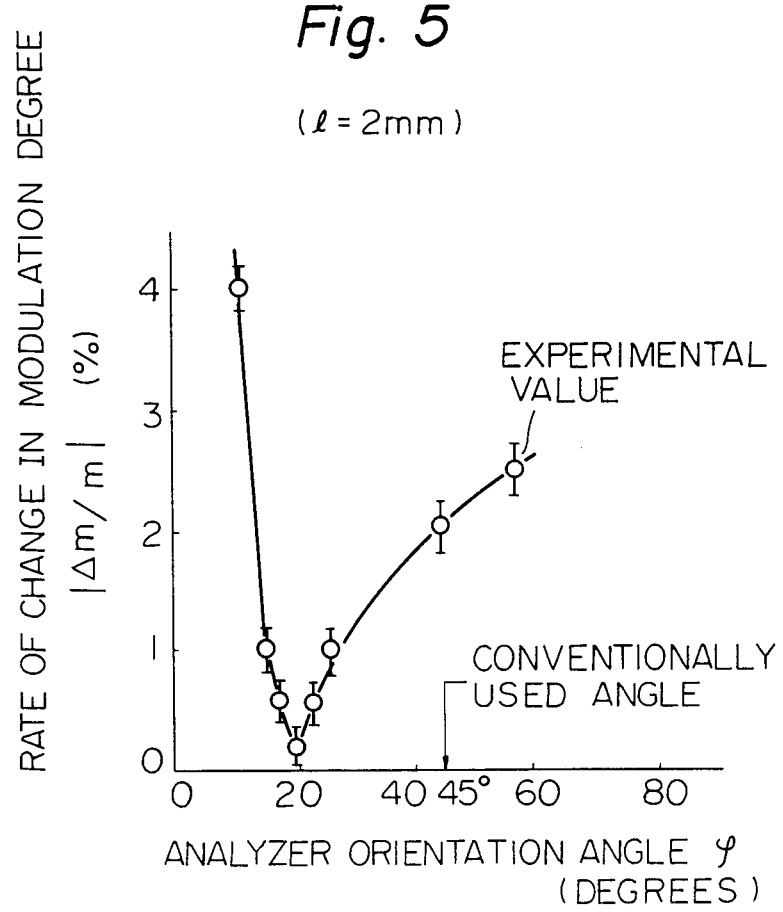
FIG. 5 is a graphical representation showing the relation between the angle of orientation of an analyzer ψ with respect to a direction <011> (along the X-axis), and the stability of modulation degree, which depends upon temperature.

FIG. 5 is a graphical representation showing the results of experiments for determining the rate of variation in modulation degree, caused by a variation in temperature of from 20° to 80° C., at various analyzer angles ranging from 10° to 60°, as well as the results of analysis, to be described below. The crystal employed consisted of BSO. The analyzer angle is plotted along the horizontal axis. The vertical axis indicates the change in modulation degree, expressed in percent, when the temperature is raised up to 80° C., taking the modulation degree at 20° C. as 100%. The experimental results show that the variation in modulation degree is a high 1.7% for a temperature variation of 60° C. (20° C.→80° C.) when the analyzer angle ψ is set to the prior-art value of 45°, the thickness l of the BSO crystal being 2 mm. In the vicinity of ψ=20°, the temperature coefficient can be regarded as being almost zero within the range of measurement error. The modulation sensitivity in this case, however, is reduced to about ⅓ of that achieved at the analyzer angle ψ of 45° commonly used in the prior art to obtain maximum sensitivity. Making ψ even smaller causes a very large and abrupt increase in the temperature induced variation of modulation degree.

The above-described effect is a newly discovered phenomenon absolutely unseen in the electro-optic materials (LiNbO₃, LiTaO₃, KDP, ADP) used heretofore. The inventors, inferring that the foregoing experimental result is ascribable to the temperature dependence of optical rotatory power and half-wave voltage, have performed a theoretical analysis and have found that said result can be explained very clearly.

Specifically, in a material which exhibits optical rotatory power, such as BSO or BGO, we may derive that a matrix (M) for effecting a conversion of the plane of polarization is expressed by the following:

$$M = \begin{pmatrix} \cos\frac{\phi}{2} - i\cos\chi\sin\frac{\phi}{2}, & -\sin\chi\sin\frac{\phi}{2} \\ \sin\chi\sin\frac{\phi}{2}, & \cos\frac{\phi}{2} + i\cos\chi\sin\frac{\phi}{2} \end{pmatrix} \quad (4)$$

Also, the incident polarized light may be expressed by the matrix:

$$(I) = \frac{1}{\sqrt{2}}\begin{pmatrix} 1 \\ i \end{pmatrix} \quad (5)$$

and the analyzer may be expressed by the matrix:

$$(A) = \begin{pmatrix} \cos\psi, & \sin\psi \\ 0, & 0 \end{pmatrix} \quad (6)$$

where:

$$\left.\begin{array}{l} \phi \approx [\omega^2\mu(\eta^2 + \gamma^2)/\epsilon]^{\frac{1}{2}} \cdot l \\ \cos\chi = (1 - \alpha^2)/(1 + \alpha^2) \\ \sin\chi = 2\alpha/(1 + \alpha^2) \\ \alpha = \gamma/(\eta + \sqrt{\eta^2 + \gamma^2}) \\ \eta = \epsilon_o\eta_o^4\gamma_{41}E_z \\ \gamma = (2\theta/\omega)(\epsilon/\mu)^{\frac{1}{2}} \end{array}\right\} \quad (7)$$

ε₀: dielectric constant in vacuum
γ₄₁: electro-optic constant
θ: optical rotatory power
E_z: electric field (Z-direction) internally of BSO crystal
ε: dielectric constant ($\epsilon_o\eta_o^2$) of BSO crystal
η₀: refractive index of BSO crystal
μ: magnetic permeability
ω: angular frequency of light
λ₀: wavelength of light If we let $E_\parallel$ represent the electric field component lying parallel to the analyzer orientation following emergence from the analyzer, and let $E_\perp$ represent the component at right angles to above component, then $E_\parallel$ can be found from the following:

$$\begin{pmatrix} E_\parallel \\ E_\perp \end{pmatrix} = (A) \times (M) \times (I) \quad (8)$$

so that we may obtain the light intensity T from:

$$T = |E_\parallel|^2 = \frac{1}{2}\left(1 - \cos\chi\sin\phi\sin2\psi + \sin2\chi\sin^2\frac{\phi}{2}\cos2\psi\right) \quad (9)$$

Using the fact that the half-wave voltage $V_\pi$ is expressed by $\lambda/2\eta_o^8\gamma_{41}$ we have:

$$\cos\chi = (\pi V/V_\pi)/\phi \quad (10)$$

$$\sin2\chi = 2 \cdot (2\theta l)\left(\pi\frac{V}{V_\pi}\right)/\phi^2 \quad (11)$$

$$\phi = \left[\left(\frac{\pi V}{V_\pi}\right)^2 + (2\theta l)^2\right]^{\frac{1}{2}} \quad (12)$$

Substituting these into Eq. (9), and letting φ=45°, we have:

$$T = \frac{1}{2}\left(1 - \frac{\pi V}{V_\pi}\frac{\sin\phi}{\phi}\right) \quad (13)$$

which is an equation in simple form wherein (sin φ)/φ is included as a coefficient in the ordinary equation expressing optical modulation. For any ψ, T may be written:

$$T = \frac{1}{2}\left(1 - \frac{\pi V}{V_\pi} \frac{\sin\phi}{\phi} \sin 2\psi + 2 \cdot \right. \tag{14}$$

$$\left. (2\theta l)\left(\pi - \frac{V}{V_\pi}\right)\left(\frac{\sin^2\frac{\phi}{2}}{\phi^2}\cos 2\psi\right)\right)$$

Accordingly, the detected degree of modulation m is expressed by:

$$m = \frac{\pi V}{V_\pi}\frac{\sin\phi}{\phi}\sin 2\psi - 2(2\theta l)\left(\pi - \frac{V}{V_\pi}\right)\left(\frac{\sin^2\frac{\phi}{2}}{\phi^2}\cos 2\psi\right) \tag{15}$$

One way to confirm the correctness of the foregoing theory experimentally is as follows. Since the first and second terms of Eq. (15) have opposite signs, the degree of modulation should not vary for a certain specified value of $\psi$ even though $V_\pi$ and $\theta$ are temperature dependent. Thus, we can verify the theory by confirming experimentally whether the degree of optical modulation remains unchanged for a specific $\psi$ in spite of a change in $V_\pi$ and $\theta$.

To this end, from the rate of change in modulation degree ($-1.7\%$ for a temperature variation of 60° C.) at the measured value ($-3 \times 10^{-30}/1°$ C./1 mm) of temperature dependence for the optical rotatory power, and at $\psi=45°$, the temperature variation of $V_\pi$ was found by reverse calculation from Eq. (13), and the rate of change in $V_\pi$ was determined to be $+2.1\%/60°$ C. Next, the rate of change in the degree of modulation (m) for the analyzer angle $\psi$ was found from Eq. (15), based on the values obtained in the foregoing results and the values measured at room temperature, werein $V_\pi=6,800$ V, $\theta=10.5°$/mm at 20° C., $V_\pi=6,942.8$ V, $\theta=10.32°$/mm at 80° C., thickness l of the BSO crystal=2 mm, and the applied voltage=200 V A.C. The rate of change is shown in FIG. 5.

It is quite clear in FIG. 5 that there is excellent agreement between the experimental values and the values obtained from the theoretical calculations, and that the temperature dependence of the modulation degree is completely cancelled by setting $\psi$ to a suitable value ($\psi \approx 19°$ in this case). It was also clarified that the variation in temperature dependence is held to within $\pm 0.1\%$ at $\psi \approx 19°$ even when the applied voltage is varied from 10 to 600 V.

The foregoing illustrates the soundness of the theory set forth hereinabove.

Figure 6:
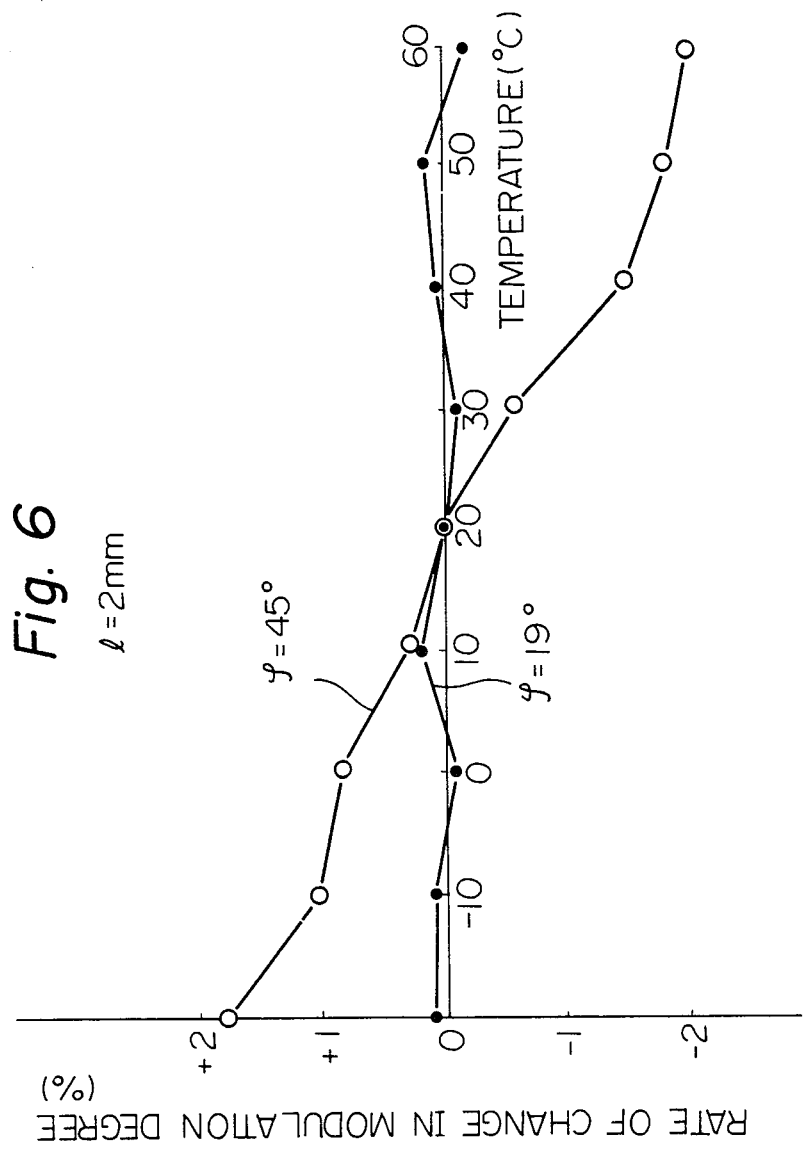
FIG. 6 is a graphical representation for comparing an embodiment of the present invention with the prior art in terms of variation in modulation degree, caused by temperature change.

Next, in order to confirm the effectiveness of the optimum $\psi$ in the foregoing theory, a polarizer, quarter-wave plate, BSO crystal (thickness: 2 mm) and analyzer were arranged in the stated order and precise measurements were taken with the analyzer angle $\psi$ set at 19°. It was verified that the fluctuation of modulation degree due to temperature change is zero at applied voltages of from 0 to 600 V, within an allowable measurement error of $\pm 0.2\%$. FIG. 6 is a graphical representation showing the experimental results for the conventional analyzer angle $\psi$ of 45° and for the above-mention analyzer angle $\psi$ of 19°, the thickness l of the crystal being 2 mm in both cases. This clearly shows the effectiveness of the optimum angle $\psi$.

Figure 7:
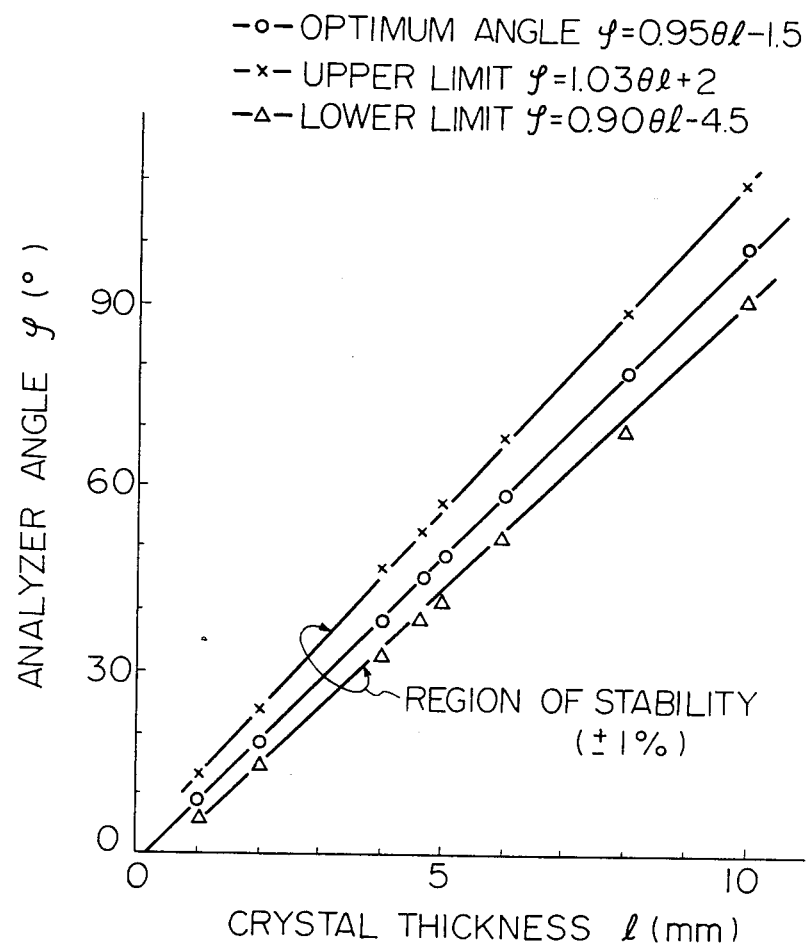
FIG. 7 is a graphical representation showing the results of an experiment regarding the relation between the thickness l of a crystal and a analyzer angle for good temperature stability.

Since it is presumed that the optimum analyzer angle will change with a change in the thickness of the crystal, the optimum analyzer angle and allowable error were measured while varying the thickness of the BSO crystal (the allowable error being the upper and lower limits of the analyzer angle for a rate of change in modulation degree of less than 1% with respect to a temperature change of 20±60° C.). As a result, it was discovered that the optimum angle is found in the approximate vicinity of the product of optical rotatory power ($\theta$) and crystal thickness l, as depicted in FIG. 7. By making use of the fact that the value of the optical rotatory power $\theta$ is 10.5°/mm at 20° C., the following empirical formula indicating the upper and lower limits of $\psi$ may be obtained:

$$(0.90 \cdot \theta l - 4.5)° \leq \psi \leq (1.03 \cdot \theta l + 2)° \tag{16}$$

In other words, if the analyzer angle $\psi$ is set with this degree of accuracy, then the fluctuation in the degree of modulation with temperature will be held to within $\pm 1\%$ for a temperature variation of 20±60° C. It was also clarified that such fluctuation can be held to within $\pm 0.2\%$ if the analyzer angle $\psi$ is set to the optimum angle expressed by the following equation:

$$\psi = (0.95 \cdot \theta l - 1.5)° \tag{17}$$

It was also confirmed that this result is explained quite easily from Eq. (15). In particular, for a crystal thickness l of 4.66 mm, the optimum angle obtained from Eq. (15) agrees with the analyzer angle $\psi$ of 45°. Under this condition, therefore, the temperature stability requirement can be satisfied without an accompanying decline in modulation sensitivity.

Figure 8:
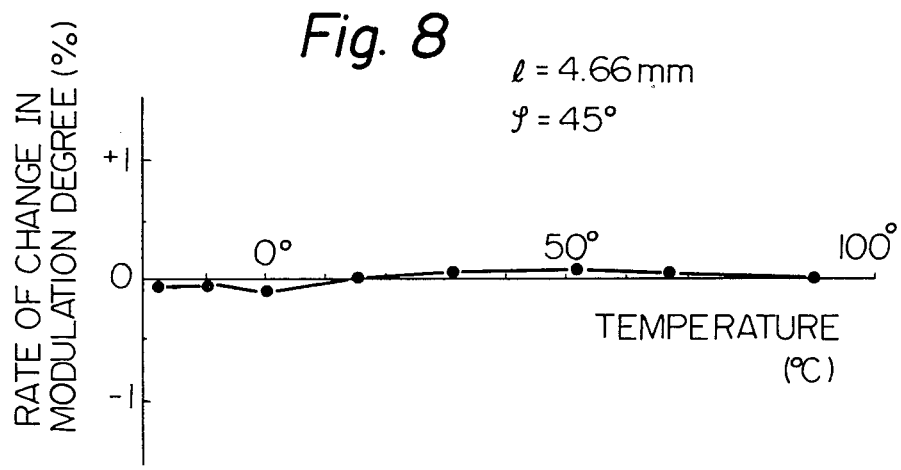
FIG. 8 is a graphical representation showing variation in modulation degree for a crystal length of 4.66 mm and an analyzer angle of 45°.

In an experiment, with the analyzer angle $\psi$ set at 45°, measurements were taken using crystals having three different thicknesses l of 4.5, 4.66 and 4.8 mm. The results indicated a temperature stability of within $\pm 0.2\%$. This condition holds for a light source having a wavelength between 800 and 900 nm, and for an optical rotatory power $\theta$ of about 10.5°/mm. FIG. 8 shows the results of an experiment for l=4.66 mm and indicates a characteristic having excellent temperature stability.

With the conventional voltage and electric field measuring device using light that relies upon an electro-optic crystal devoid of an optical rotatory power, it is usual practice to incline the polarization plane of the analyzer at an angle of 45° with respect to the optic axis of the crystal in order to obtain the best sensitivity and linearity, as already described hereinabove. The applicant has previously invented and filed for patent a voltage and electric field measuring device utilizing an electro-optic crystal having an optical rotatory power. Even in a case where the electro-optic crystal with optical rotatory power is employed, however, the polarization plane of the analyzer must still be inclined by an angle $\psi$ of 45° with respect to the optical axis of the crystal to obtain the optimum sensitivity and linearity. One might presume, therefore, that the analyzer should be inclined at an angle $\psi$ equal to 45°+$\theta l$, obtained merely by adding the optical rotatory angle to the angle of 45°. It should be noted, however, that the analogy is a mistaken one.

The present invention is based on the results of experiments performed with the goal of obtaining a voltage and electric field measuring device which is stable against temperature changes, even at the sacrifice of sensitivity. As a result of such experiments, it was found that the goal can be attained by using an electro-optic crystal having optical rotatory power, while observing the relation $\psi \approx \theta l$. The present invention utilizes this discovery. Then, since it is possible in the equation $\psi \approx \theta l$ to select the optical rotatory power $\theta$ of the electro-optic crystal and the thickness l in the direction of advancement of light in such a manner that $\theta \approx 45°$, it is obvious that the temperature characteristic can be stabilized without even sacrificing sensitivity and linearity.

The inventors have confirmed that the optical rotatory power of BGO is the same as that of BSO within the range of experimental error. It is obvious, then, that the same results can be obtained if BSO and BGO are employed under the same conditions.

The present specification describes in some detail the use of an electro-optic crystal of BSO or BGO. It goes without saying, however, that a voltage and electric field measuring device having excellent temperature stability can be obtained using other crystals exhibiting both optical rotatory power and an electro-optic effect, providing that similar conditions are established in accordance with the optical rotatory power of the particular crystal.

In the foregoing, the experiments and results of analysis relate to counter-clockwise optical rotatory power, looking in the direction in which the light advances. Upon studying BSO and BGO crystals having clockwise optical rotatory power [wherein $\theta$ in Eq. (15) is substituted by $-\theta$], it was verified that the results obtained are identical to those obtained with counter-clockwise rotatory power provided that the direction in which the analyzer is rotated is the same as the direction of the optical rotatory power.

Figure 9:
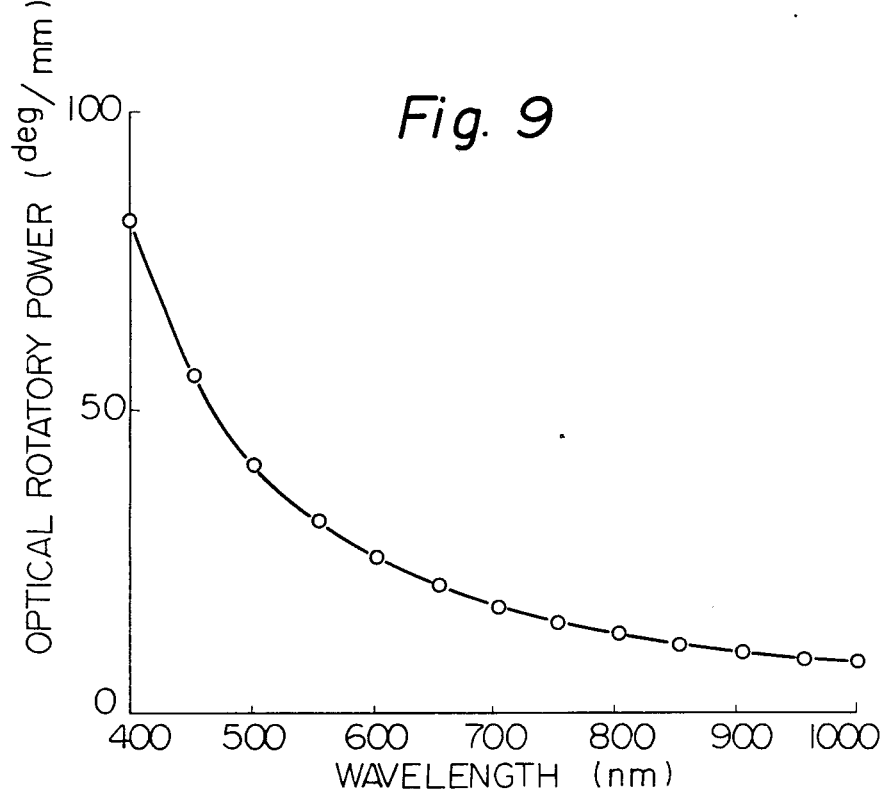
FIG. 9 is a graphical representation showing the relation between optical wavelength and the optical rotatory power of BSO and BGO.

The discussion thus far has dealt with the effects obtained with light at a wavelength of 800 to 900 nm and an applied voltage of 0 to 600 V. It should be noted, however, that the foregoing does not constitute a restriction upon the wavelengths or applied voltages which can be used. For example, as shown in FIG. 9, the optical rotatory power of BSO and BGO decreases with an increase in the wavelength of light, and there is an increase in the half-wave voltage. Therefore, the result for optimum temperature stability can be obtained if $\psi$ and l are selected in accordance with the wavelength band used. Likewise, with regard to the applied voltage, excellent temperature stability can be obtained if the proper conditions are selected, even in cases where a high voltage (1000 to 4000 V) is applied. No problems with linearity are encountered.

Thus, even under very general conditions, excellent temperature stability can be obtained in the required temperature region if $\psi$ and l are suitably selected upon measuring the temperature dependence of the optical rotatory power and half-wave voltage under the particular conditions which prevail.

In the embodiment described above, the direction in which the light advances and the direction of the voltage and field are parallel (longitudinal type arrangement). However, the same explanation as set forth hereinabove applies even if the voltage and field direction is at right angles to the direction of light advancement (transverse type arrangement).

Figure 1C:
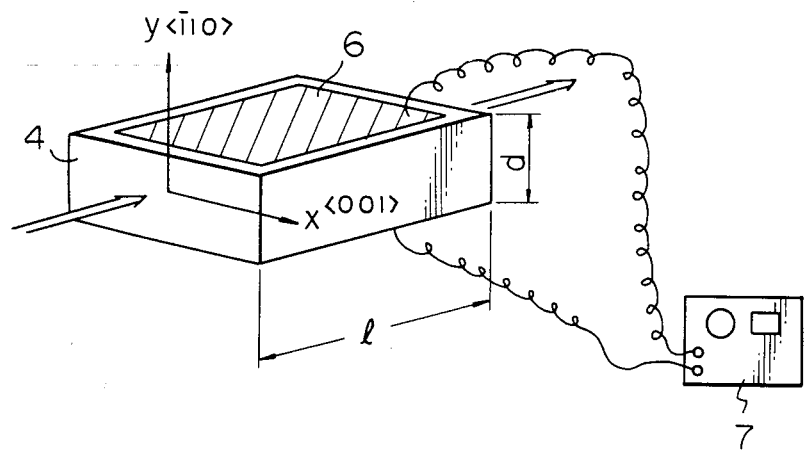
FIG. 1(c) is a view showing the basic arrangement of a voltage and electric field measuring device using light, in which the electro-optic crystal is transversely disposed.
Figure 2:
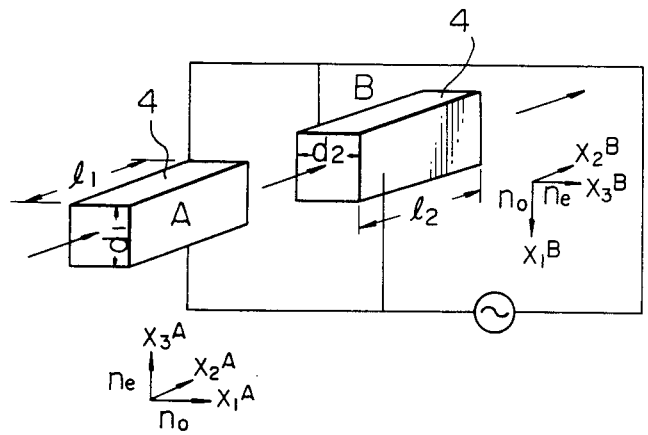
FIG. 2 is a view showing the arrangement of a temperature compensation-type electro-optic crystal.
Figure 3:
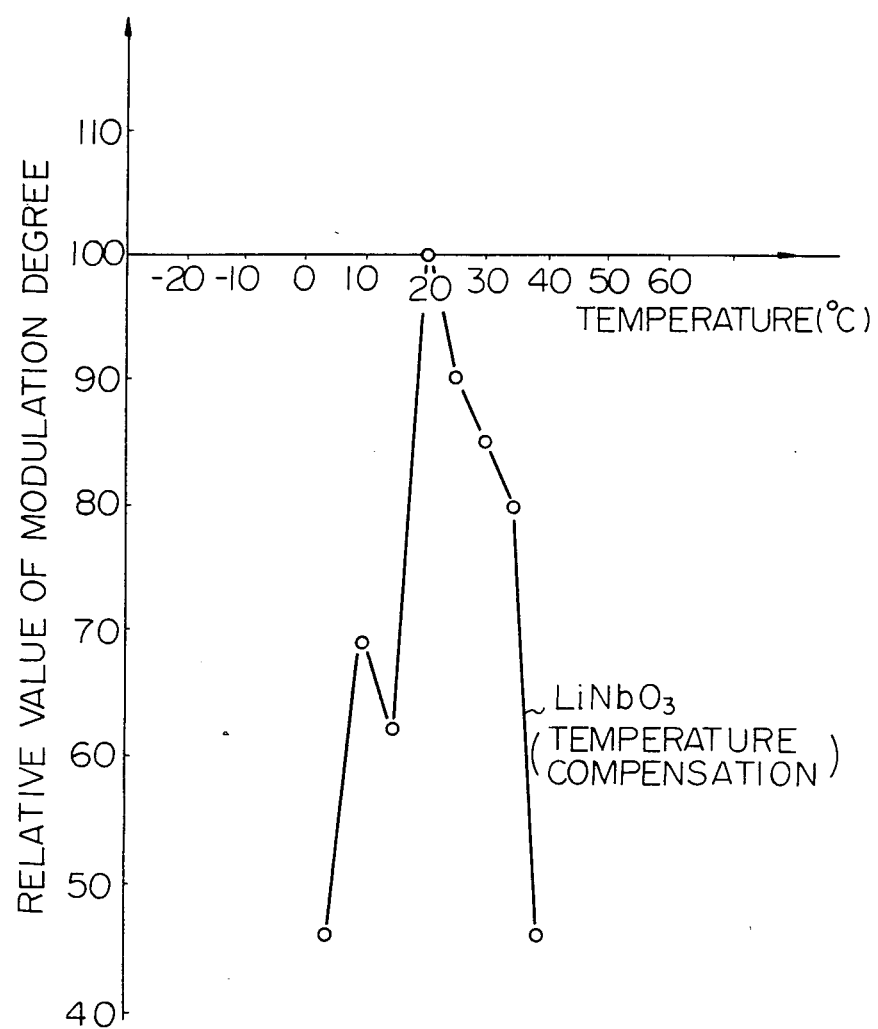
FIG. 3 is a temperature characteristic diagram showing the variation in relative degree of modulation with temperature for a constant input voltage applied to a temperature compensation-type voltage and electric field measuring device using a crystal of LiNbO$_3$.

Referring to FIG. 1(c), a voltage V is applied at right angles ($<\bar{1}10>$ direction) to the direction ($<110>$) in which the light advances. In such case the electric field E internally of the BSO crystal is given by $E = V/d$. Since the thickness (length) of the crystal is represented by l, the effect of the voltage is expressed by $V \times l/d$. Sensitivity thus is enhanced l/d-fold in comparison with the arrangement of FIG. 1(a). Substituting Vl/d for V in Eq. (15) gives us the following equation:

$$m = \frac{\pi Vl}{V_\pi d} \frac{\sin\phi}{\phi} \sin2\psi - 2(2\theta l)\left(\frac{\pi Vl}{V_\pi d}\right) \frac{\sin^2\frac{\phi}{2}}{\phi^2} \cos2\psi \quad (18)$$

As for the value of $\phi$, substituting Vl/d for V in Eq. (12) gives us:

$$\phi = \left[\left(\frac{\pi Vl}{V_\pi d}\right)^2 + (2\theta l)^2\right]^{\frac{1}{2}} \quad (19)$$

Using the transverse-type arrangement of FIG. 1(c), an experiment was conducted under the following conditions: $l = 4.66$ mm, $d = 1.5$ mm, $\psi = 45°$. It was verified that a sensitivity is obtained which is about three times that afforded by the longitudinal-type arrangement of FIG. 1(a), and that the temperature stability is within $\pm 0.2\%$ for a temperature variation of $20 \pm 60°$ C.

In accordance with the present invention as described hereinabove, the analyzer is rotated in the same direction and through the same angle as the plane of polarization which is rotated by the electro-optic crystal having the optical rotatory power, thereby reducing the temperature-induced variation in the output light intensity, which variation is attributed to the temperature dependence of the half-wave voltage and optical rotatory power. This provides a voltage and electric field measuring device, using light, which is extremely stable against fluctuations in temperature. The device of the present invention therefore is very useful for measuring and monitoring voltages and electric fields in permanent power system facilities and in environments where there are severe variations in temperature.

As many apparently widely different embodiments of the present invention may be made without departing from the spirit and scope thereof, it is to be understood that the invention is not limited to the specific embodiments thereof but only as defined in the appended claims.

What is claimed is:

1. A combination of parts for use in a device using light traveling along a given path and passing through an electro-optic crystal to measure either a voltage applied to the electro-optic crystal or an electric field in which the electro-optic crystal is immersed and which device is used in an environment wherein the temperature varies within a given temperature range, said combination comprising:

a polarizer, an electro-optic crystal, and an analyzer each located in said given path and arranged in the stated order in the direction of advancement of light along said path, and a quarter-wave plate located in said path between said polarizer and said analyzer, said electro-optic crystal consisting of a material having an optical rotatory power, and said analyzer having its orientation rotated through an angle substantially equivalent to an angle $\psi$ given by the following equation:

$\psi \approx \theta l$ relative to the optical axis of said electro-optic crystal, where $\theta$ represents the optical rotatory power, with respect to the applied light, of said electro-optic crystal near a point at the center of said given temperature range, and l represents the thickness of the electro-optic crystal measured in the direction of advancement of light along said path.

2. The combination of claim 1 wherein said electro-optic crystal consists of a material selected from the group consisting of bismuth silicon oxide ($Bi_{12}SiO_{20}$) and bismuth germanium oxide ($Bi_{12}GeO_{20}$).

3. The combination of claim 1 wherein the wavelength of the applied light is between 800 and 900 nm, and the orientation $\psi$ of said analyzer satisfies the following relation:

$$(0.90\theta l - 4.5)° \leq \psi \leq (1.03\theta l + 2)°.$$

4. The combination of claim 1 wherein the wavelength of the applied light is between 800 and 900 nm, and the orientation $\psi$ of said analyzer substantially satisfies the following relation:

$$\psi = (0.95\theta l - 1.5)°.$$

5. A combination of parts for use in a device using light traveling along a given path and passing through an electro-optic crystal to measure either a voltage applied to the electro-optic crystal or an electric field in which the electro-optic crystal is immersed and which device is used in an environment wherein the temperature varies within a given temperature range, said combination comprising:

a polarizer, an electro-optic crystal, and an analyzer, each located in said given path and arranged in the stated order in the direction of advancement of light along said path, and a quarter-wave plate located in said path between said polarizer and said analyzer, said electro-optic crystal consisting of a material having an optical rotatory power, said analyzer having its orientation rotated through an angle of approximately 45° relative to the optical axis of said electro-optic crystal, and the thickness of said electro-optic crystal in the direction of the advancement of light being given by the following equation:

$$l \approx 45°/\theta$$

where $\theta$ represents the optical rotatory power, with respect to the applied light, of said electro-optic crystal near a point at the center of said given temperature range.

6. The combination of claim 5 wherein said electro-optic crystal consists of a material selected from the group consisting of bismuth silicon oxide ($Bi_{12}SiO_{20}$) and bismuth germanium oxide ($Bi_{12}GeO_{20}$).

7. The combination of claim 5 wherein the wavelength of the applied light is between 800 and 900 nm, and the thickness l of said electro-optic crystal is between 4.5 and 4.8 mm.

* * * * *